US 6,659,116 B1

(12) United States Patent
Williams et al.

(10) Patent No.: US 6,659,116 B1
(45) Date of Patent: *Dec. 9, 2003

(54) SYSTEM FOR WAFER CARRIER IN-PROCESS CLEAN AND RINSE

(75) Inventors: Damon Vincent Williams, Fremont, CA (US); Glenn W. Travis, Sherman Oaks, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/319,758

(22) Filed: Dec. 13, 2002

Related U.S. Application Data

(63) Continuation-in-part of application No. 09/603,573, filed on Jun. 26, 2000, now Pat. No. 6,505,636.

(51) Int. Cl.⁷ .................................................. B08B 3/02
(52) U.S. Cl. ........................ 134/176; 134/179; 134/200; 134/902; 15/320; 15/322
(58) Field of Search ........................ 134/172, 176, 134/179, 200, 902; 451/67, 73; 15/320, 321, 322

(56) References Cited

U.S. PATENT DOCUMENTS

| 4,141,180 | A | | 2/1979 | Gill, Jr. et al. ............... 51/5 R |
| 4,193,226 | A | | 3/1980 | Gill, Jr. et al. ............ 51/124 R |
| 4,680,893 | A | | 7/1987 | Cronkhite et al. ............. 51/5 R |
| 5,135,015 | A | | 8/1992 | Young ........................ 134/179 |
| 5,253,809 | A | | 10/1993 | Poppitz et al. ............... 239/257 |
| 5,351,360 | A | | 10/1994 | Suzuki et al. .................. 15/302 |
| 5,573,023 | A | * | 11/1996 | Thompson et al. ........... 134/66 |
| 5,624,501 | A | | 4/1997 | Gill, Jr. ......................... 134/6 |
| 5,711,051 | A | * | 1/1998 | Roden ......................... 15/321 |
| RE37,162 | E | * | 5/2001 | Roden ......................... 15/321 |
| 6,287,178 | B1 | | 9/2001 | Huynh et al. ................. 451/73 |
| 6,336,845 | B1 | | 1/2002 | Engdahl et al. ............... 451/41 |
| 6,486,550 | B1 | | 11/2002 | Travis ......................... 257/726 |

* cited by examiner

*Primary Examiner*—Randy Gulakowski
*Assistant Examiner*—Joseph L. Perrin
(74) *Attorney, Agent, or Firm*—Brinks Hofer Gilson & Lione

(57) ABSTRACT

A system for rinsing and cleaning a wafer carrier and a semiconductor wafer mounted thereon during a polishing process is provided. The system comprises a head spray assembly that includes a spray nozzle and a spray cavity. At least a part of the head spray assembly is moveably positionable between a park position and a spray position. The spray position is proximate to the wafer carrier such that liquid discharged from the spray nozzle is in liquid communication with the wafer carrier and the semiconductor wafer. The liquid as well as the materials rinsed from the wafer carrier and semiconductor wafer may be retained in the spray cavity and channeled out of the head spray assembly.

25 Claims, 10 Drawing Sheets

SYSTEM FOR WAFER CARRIER IN-PROCESS CLEAN AND RINSE

This application is a Continuation-In-Part of U.S. patent application Ser. No. 09/603,573 filed on Jun. 26, 2000 entitled "Method and Apparatus for Wafer Carrier In-Process Clean and Rinse." that is now U.S. Pat. No. 6,505,636.

FIELD OF THE INVENTION

The present invention relates to the planarization of semiconductor wafers using a chemical mechanical planarization technique. More particularly, the present invention relates to an improved system and method for cleaning and rinsing residual slurry from semiconductor wafers during the chemical mechanical planarization process.

BACKGROUND

Semiconductor wafers are typically fabricated with multiple copies of a desired integrated circuit design that will later be separated and made into individual chips. Wafers are commonly constructed in layers, where a portion of a circuit is created on a first level and conductive vias are made to connect up to the next level of the circuit. After each layer of the circuit is etched on the wafer, an oxide layer is put down allowing the vias to pass through but covering the rest of the previous circuit level. Each layer of the circuit can create or add unevenness to the wafer that must be smoothed out before generating the next circuit layer.

Chemical mechanical planarization (CMP) techniques are used to planarize the raw wafer and each layer of material added thereafter. Available CMP systems, commonly called wafer polishers, often use a rotating wafer carrier that brings the wafer into contact with a polishing pad rotating in the plane of the wafer surface to be planarized. A polishing fluid, such as a chemical polishing agent or slurry containing microabrasives is applied to the polishing pad to polish the wafer. The wafer carrier then presses the wafer against the rotating polishing pad and is rotated to polish and planarize the wafer.

Following the polishing and planarization operation, the wafer carrier is lifted off of the polishing pad and retained in a conveyor that is used to transport the wafer and wafer carrier. The external surfaces of the wafer carrier and the face of the wafer are typically coated with the residual polishing fluid and the material removed from the wafer surface during the operation. These materials are typically removed using deionized water (D.I. water). Presently known methods of material removal involve manual spraying or a head diametrical wash system. Manual spraying is accomplished with a spray hose that is manipulated by an operator of the CMP system.

The head diametrical wash system comprises fixed holes that are included on the conveyor. The holes surround the upper portion of the wafer carrier when it is retained in the conveyor. The holes are piped to a D.I. water supply that is pressurized to spray D.I. water out the holes and onto the outer surface of the wafer carrier. The D.I. water flows by gravity down the outer surfaces of the wafer carrier and across the horizontal face of the wafer that is mounted on the bottom of the wafer carrier. The D.I. water containing the materials rinsed from the wafer carrier and wafer then forms into droplets that drip from the wafer down onto the polishing pad and elsewhere in the CMP system.

Known problems exist with these rinsing and cleaning techniques. Specifically, the manual spraying is time consuming, manpower intensive, generates overspray on other parts of the CMP system and may provide non-uniform results. In the case of the diametrical face wash, the washing action lacks scrubbing effect. In addition, the flow of the D.I. water across the face of the semi-conductor wafer is non-uniform since it depends on the molecular attraction of the water to the surfaces of the wafer carrier and the wafer. The non-uniform flow of water may contribute to non-uniform washing of the wafer. This is especially true as the diameter of the face of the wafer is increased. Further, the D.I. water containing the residual polishing fluid and the material removed from the wafer surface is allowed to run into the CMP system thereby contributing additional foreign materials and particulate to the CMP process.

Accordingly, there is a need for systems and methods of rinsing and cleaning wafer carriers and semiconductor wafers that is automatic, efficient, thorough and capable of being contained.

SUMMARY

To address the deficiencies of the prior art, systems are described herein that are capable of automated operation in a CMP system to provide a uniform, thorough and efficient cleaning and rinsing of a wafer carrier and a semiconductor wafer mounted thereon. The system includes a head spray assembly. At least a portion of the head spray assembly is moveable between a park position and a spray position. In the spray position, the head spray assembly is adjacent a wafer carrier.

The head spray assembly includes at least one spray nozzle and a housing having a spray cavity. In addition, the head spray assembly may include at least one seal. The spray cavity may contain and capture liquid discharged from the spray nozzle. The seal may be utilized to assist in retaining the liquid in the spray cavity. Upon activation, the spray nozzle may discharge pressurized liquid into the housing. The liquid discharged from the spray nozzle may be in liquid communication with the wafer carrier and the semiconductor wafer thereon. The discharged liquid may clean and rinse the wafer carrier and semiconductor wafer. The liquid that washes the wafer carrier and the semiconductor wafer may be contained due to the seal and the spray cavity. Liquid captured in the spray cavity may be channeled by gravity to a drain outlet for transfer out of the head spray assembly.

Other features and advantages of the invention will be apparent from the drawings and the more detailed description of the invention that follows. The foregoing discussion of the preferred embodiments has been provided only by way of introduction. Nothing in this section should be taken as a limitation on the following claims, which define the scope of the invention.

DETAILED DESCRIPTION

Figure 1:
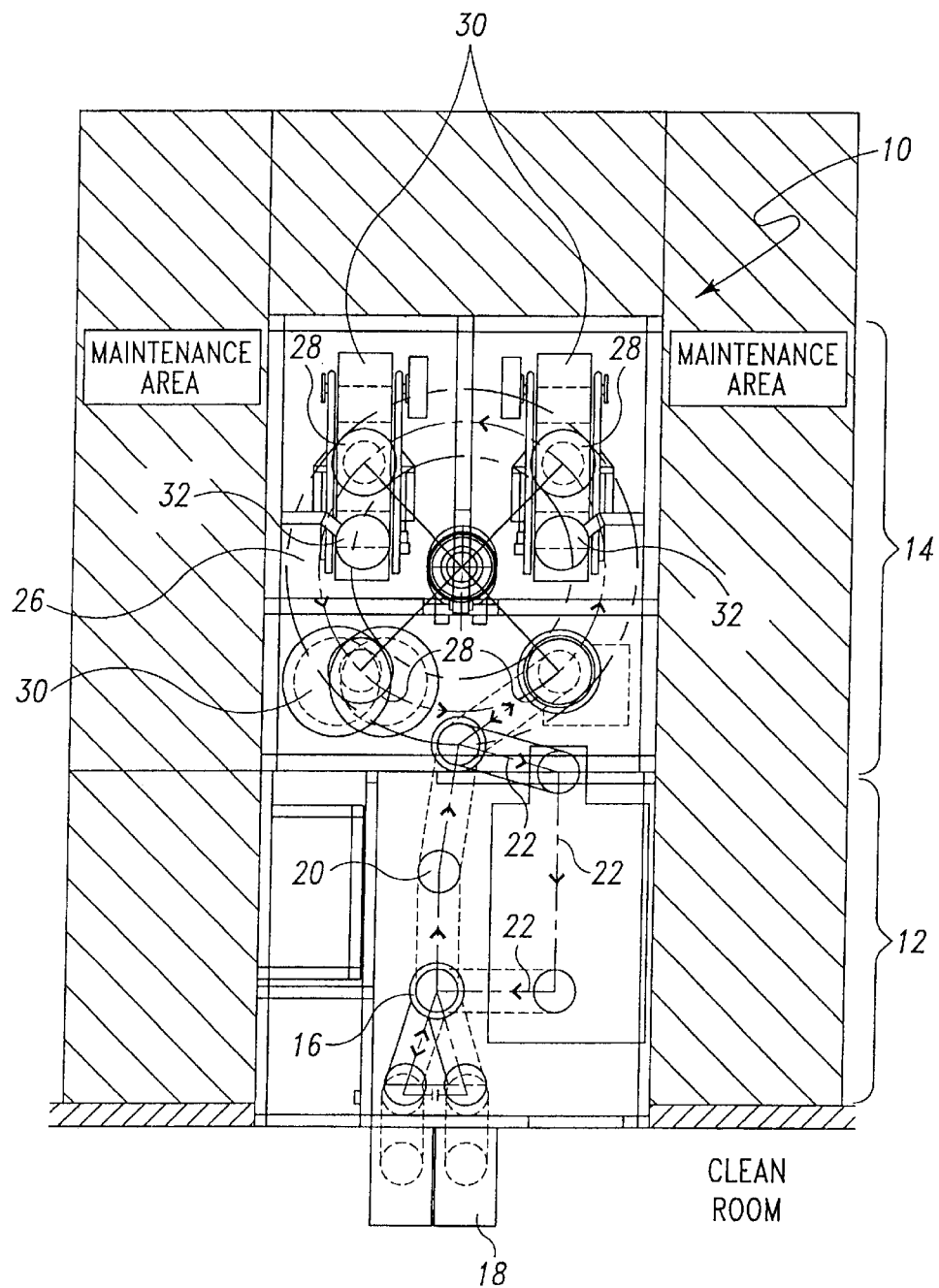
FIG. 1 is a plan view schematic of an example semiconductor wafer polishing system.

An example of a wafer polishing system 10 is generally illustrated in FIG. 1. One representative automated wafer polishing system 10 is the TERES™ Chemical Mechanical Polishing (CMP) system available from Lam Research Inc. located in Fremont, Calif. FIG. 1 is a plan view of the wafer polishing system 10 that includes a front-end portion 12 connected to a back-end portion 14. The wafer polishing system 10, typically used in a semiconductor wafer fabrication facility, receives semiconductor wafers 16 at the front-end portion 12 from a wafer holder 18 that is adjacent to the front-end portion 12. The semiconductor wafers 16, hereinafter referred to as wafers 16, are circular shaped discs that are separable into individual chips containing integrated circuits. The wafer holder 18 is a rack or other similar structure capable of holding the wafers 16 in a uniform and organized fashion.

The front-end portion 12 retrieves the wafers 16 from the wafer holder 18 and transfers the wafers 16 to the back-end portion 14 as illustrated generally by arrow 20. The back-end portion 14 planarizes the wafers 16 and then returns the wafers 16 to the front-end portion 12 for final cleaning, rinsing and drying. In general, the wafers 16 are completely processed in the front and back end portions 12,14 and are then returned to a predetermined location, in a clean, dry, and uniformly planarized condition. In the illustrated wafer polishing system 10, the wafers 16 are returned to the wafer holder 18 as illustrated by arrows 22.

The back-end portion 14 of the example wafer polishing system 10 includes a conveyor 26, a plurality of wafer carriers 28, a plurality of belt polishing modules (BPMs) 30 and a plurality of head spray mechanisms 32. Individual wafers 16 that are transferred from the front-end portion 12 are received by the back-end portion 14 and loaded onto the conveyor 26. The conveyor 26 could be a longitudinally extending belt, a robot arm or any other mechanism capable of conveying wafers 16. The presently preferred conveyor 26 is a generally circular table that is rotatably controlled by a motor (not shown).

Figure 2:
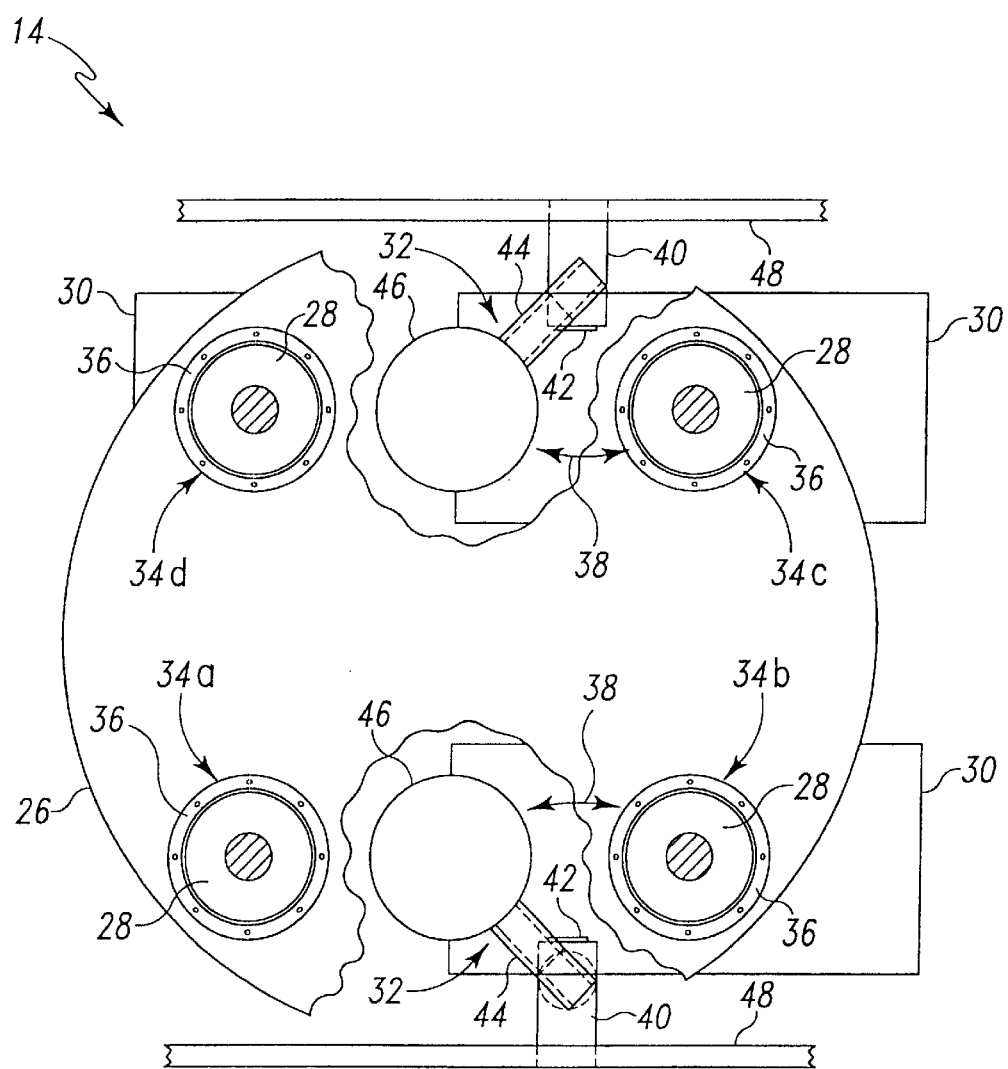
FIG. 2 is a plan view schematic of a portion of the semiconductor wafer polishing system of FIG. 1 with portions of an example conveyor broken away.

FIG. 2 illustrates a plan view of a part of the back-end portion 14 illustrated in FIG. 1 with portions of the conveyor 26 removed for illustrative purposes. In the illustrated example, the conveyor 26 includes four stations 34; namely, a load/unload station 34a, a first polishing station 34b, a second polishing station 34c and a buff station 34d. The conveyor 26 could, for example, have more stations 34 providing similar or different functions as required by the wafer polishing system 10.

Each station may include a wafer carrier 28 that is detachably coupled to the conveyor 26 by a head retainer ring 36. The head retainer ring 36 may be fixedly coupled to the conveyor 26 by fasteners, such as, for example, nuts and bolts, welding, rivets or any other fastening mechanism. The coupling of the wafer carrier 28 and the head retainer ring 36 can be, for example, by friction fit, snap fit, threaded connection or other similar detachably connective mechanism. A more detailed discussion of some methods and systems of detachably coupling the conveyor 26 with the wafer carriers 28 is described in U.S. patent entitled "Locking Mechanism for Detachably Securing a Wafer Carrier to a Conveyor" to Travis, U.S. Pat. No. 6,486,550 issued on Nov. 26, 2002 that is herein incorporated by reference. When the wafer carrier 28 is detachably coupled with the conveyor 26, an annular cavity (not shown) that is open at one end is formed between the wafer carrier 28 and the conveyor 26.

The wafers 16 are loaded onto the conveyor 26 at the load/unload station 34a by being positioned on the wafer carriers 28. The wafer carriers 28 are an assembly capable of fixedly holding the wafers 16 during processing. In the illustrated example, the wafers 16 may be positioned on a bottom face (not shown) of the wafer carriers 28 by surface tension or partial vacuum. The wafer 16 may be positioned such that the circular face of the wafer 16 that is subject to planarization radially extends to cover a portion of the bottom of the wafer carrier 28.

When the wafer carriers 28 are selectively positioned at the first polishing station 34b, the second polishing station 34c and the buff station 34d, the wafer carriers 28 are located above the BPMs 30. The presently preferred BPMs 30 are positioned such that the wafer carriers 28 can be detached from the conveyor 26 and lowered to make contact between the face of the wafer 16 and the BPMs 30 during a polishing operation. The BPMs 30 can be, for example, linear or rotary wafer polishers that operate to remove material from the surface of the wafers 16 using polishing fluid such as a chemical agent or a slurry containing micro abrasives. In the illustrated example, there are three BPMs 30 comprising first and second polishers and a buffer.

The head spray mechanisms 32 operate to rinse and clean the wafer carriers 28 and the respective wafer 16 thereon. The head spray mechanisms 32 can be adapted for use anywhere in the wafer polishing system 10 where washing is required. In the illustrated example, the head spray mechanisms 32 are positioned under the conveyor 26 and are associated with the first and second polisher stations 34b and 34c. The head spray mechanisms 32 are independently operable to discharge pressurized liquid when actuated.

The head spray mechanisms 32 may be deactivated and placed in a first position during polishing operations at the respective stations 34b, 34c. The first position is referred to as a park position and is illustrated in FIG. 2. The head spray mechanisms 32 are also independently capable of being moved to a second position adjacent the wafer carriers 28 as illustrated by arrows 38 that is referred to as a spray position. In the park position, the head spray mechanisms 32 may be spaced away from the wafer carrier 28 a sufficient distance to avoid interference with the polishing operation. Conversely, in the spray position, a portion of the head spray mechanisms 32 may be positioned at the respective first and second polishing stations 34b and 34c.

During operation, when the wafer carriers 28 are detachably coupled with the conveyor 26 following a polishing operation, the head spray mechanisms 32 may be activated in an automated fashion. The wafer polishing system 10 determines when to activate the head spray mechanisms 32 by monitoring the coupling of the wafer carriers 28 with the conveyor 26. Coupling of the wafer carriers 28 with the conveyor 26 may be determined by, for example, limit switches, proximity switches or predetermined positioning of the wafer carriers 28. When the wafer carriers 28 are successfully coupled with the conveyor 26, the head spray mechanisms 32 may be moved to the spray position by the wafer polishing system 10.

In the spray position, each head spray mechanism 32 may be positioned adjacent a wafer carrier 28 with a wafer 16 disposed between the wafer carrier 28 and the head spray mechanism 32. When the head spray mechanism 32 is actuated in the spray position, pressurized liquid may be discharged. The pressurized liquid may be in liquid communication with the wafer 16 and the wafer carrier 28 to provide a rinsing and cleansing action of the wafer 16 and the wafer carrier 28. The liquid discharged by the head spray mechanism 32 is contained and channeled to a drain outlet 98 (see FIGS. 6.and 7) for removal from the wafer polishing system 10 as described later. The position of the head spray mechanism 32 with respect to the wafer carrier 28 when in the spray position may be above, below, beside or some combination thereof.

The presently preferred head spray mechanism 32 operates to clean residual slurry and other particulate material from the wafer 16 and the wafer carrier 28 following each polishing operation. The cleaning action is aggressive and provides uniform removal of the residual polishing fluid and the materials removed from the surface of the wafer 16. The fluids and materials are removed by pressurized liquid that is contained and collected by the head spray mechanism 32. Containment and collection prevents introduction of the liquid containing the polishing fluid and materials removed from the surface of the wafer 16 to other portions of the wafer polishing system 10.

Figure 3:
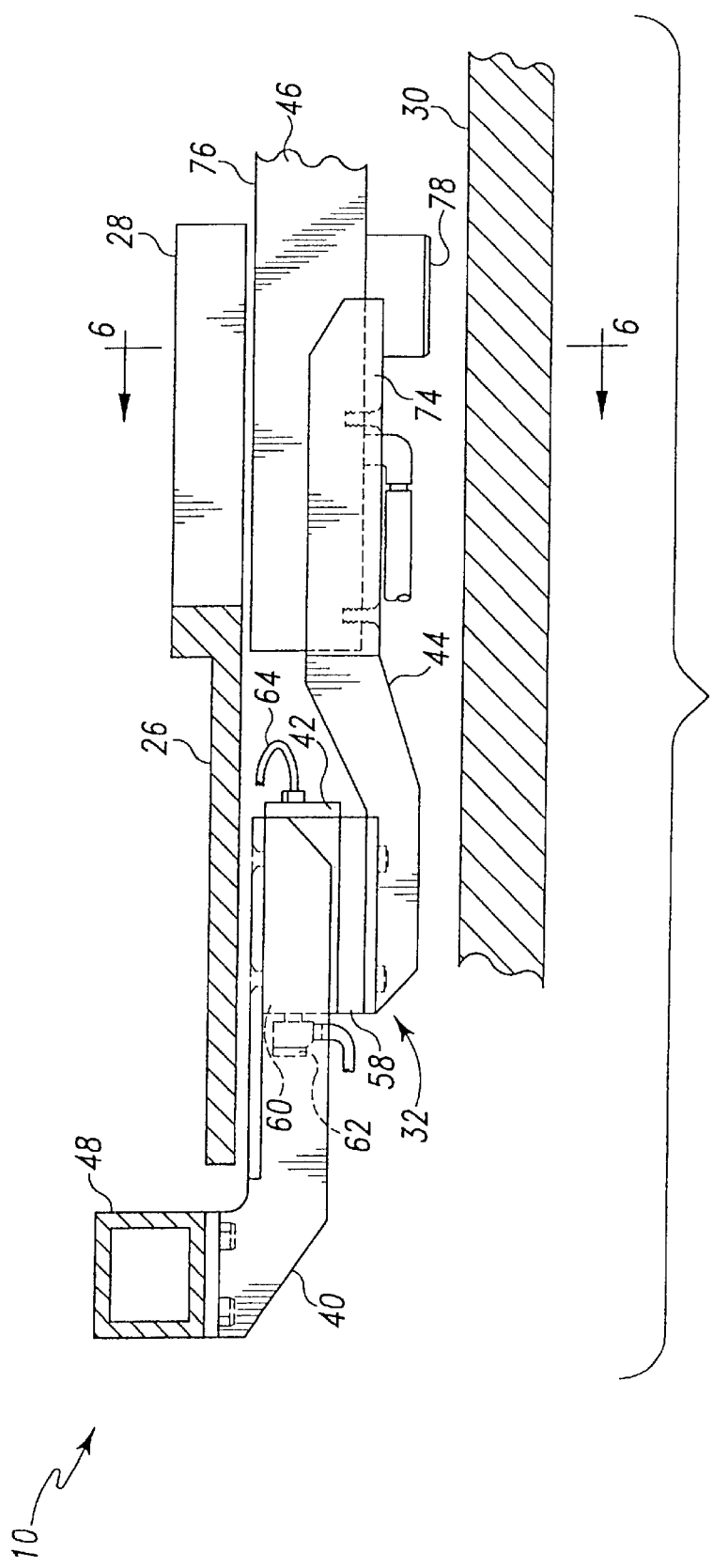
FIG. 3 is an elevation side view of a portion of the semiconductor wafer polishing system of FIG. 2 with portions of the conveyor, BPM and frame broken away.

As further illustrated in FIG. 2, the presently preferred head spray mechanism 32 comprises a mounting bracket 40, a rotary actuator 42, a rotary arm 44 and a head spray assembly 46. FIG. 3 illustrates an elevation view of a portion of the wafer polishing system 10 illustrated in FIG. 2 with a portion of the conveyor 26 sectioned away to more fully illustrate the wafer carrier 28 and the head spray mechanism 32. Referring now to FIGS. 2 and 3, a portion of the head spray mechanism 32 may be positioned between the conveyor 26 and one of the BPMs 30 as shown. The head spray mechanism 32 may be fixedly mounted to a frame 48 that forms a part of the back-end portion 14 of the wafer polishing system 10. The frame 48 can be formed from steel, for example, or some other rigid material capable of supporting the head spray mechanism 32. The head spray mechanism 32 may be fixedly coupled to the frame 48 by the mounting bracket 40.

Figure 4:
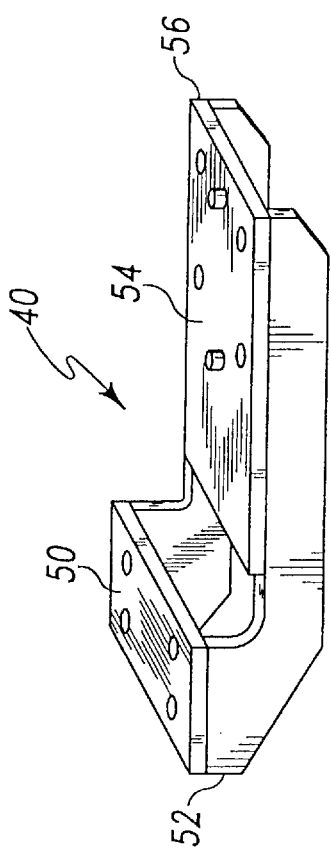
FIG. 4 is a perspective view of an example mounting bracket illustrated in FIG. 3.

Referring now to FIG. 4, the example mounting bracket 40 is illustrated in a perspective view detached from the frame 48 and the remainder of the head spray mechanism 32. The mounting bracket 40 may be formed from rigid material such as, for example, metal, plastic or other similar material with corrosive resistant properties and sufficient axial and torsional strength to support the remainder of the head spray mechanism 32. The top surface of a first plate 50 at a proximal end 52 of the longitudinally extending mounting bracket 40 may be coupled to the frame 48 by fasteners, such as, for example, nuts and bolts, rivets, welding or similar fastening mechanism. The illustrated mounting bracket 40 may be formed from welded ¼" stainless plate that is coupled to the frame 48 by bolts and screws. The bottom surface of a second plate 54 at a distal end 56 of the mounting bracket 40 may be coupled to the rotary actuator 42.

Referring again to FIGS. 2 and 3, the rotary actuator 42 may be a device capable of rotational movement of a shaft or similar rotatable element when activated. The rotary actuator 42 can be, for example, a pneumatic or electric actuator that is impervious to a corrosive, wet environment and can be controlled remotely. One suitable rotary actuator 42, is the pneumatic rotary actuator model number RR-36 manufactured by Robohand Inc.

The rotary actuator 42 may include a rotatable head 58 and a base 60. The illustrated base 60 is fixedly coupled to the distal end 56 of the mounting bracket 40 by fasteners, such as, for example, bolts and screws, dowel pins or similar fastening mechanism. As shown, the illustrated base 60 is fastened to the mounting bracket 40 by nuts and bolts and includes dowel pins. In addition, a plurality of pneumatic air supply lines 62 and a plurality of electrical cables 64 may also be coupled to the rotary actuator 42. The pneumatic air supply lines 62 may be coupled with a pressurized air source (not shown) that selectively supplies pressurized air to the lines 62. The electrical cables 64 may electrically connect a plurality of limit switches (not shown) located within the rotary actuator 42 with the wafer polishing system 10.

The rotatable head 58 may be rotatably connected to the base 60. In addition, the rotatable head 58 may be fixedly coupled to the rotary arm 44 by fasteners, such as, for example, nuts and bolts, rivets, welding or similar fastening mechanism. In the illustrated example, the rotatable head 58 may be a flat plate formed from steel or similar material that is adapted to be fixedly coupled to the rotary arm 44 by nuts and bolts and includes dowel pins to maintain alignment. The base 60 may include a motor or similar prime mover (not shown) that is capable of imposing rotatable torque on the rotatable head 58 when actuated. The illustrated wafer polishing system 10 controls the operation of the rotary actuator 42 by selectively pressurizing the pneumatic air supply lines 62 and monitoring the status of the limit switches. The rotatable head 58 rotates to pivotally swing the rotary arm 44 to predetermined positions.

Alternatively, the rotary arm 44 may be moved in a substantially straight line to predetermined positions. In this alternative, the rotary arm 44 may be moved using a track, a boom, a carriage, a conveyor, a robotic arm or any other mechanism and associated actuator capable of providing movement. Movement of the rotary arm may be vertical, horizontal, or some combination thereof.

Figure 5:
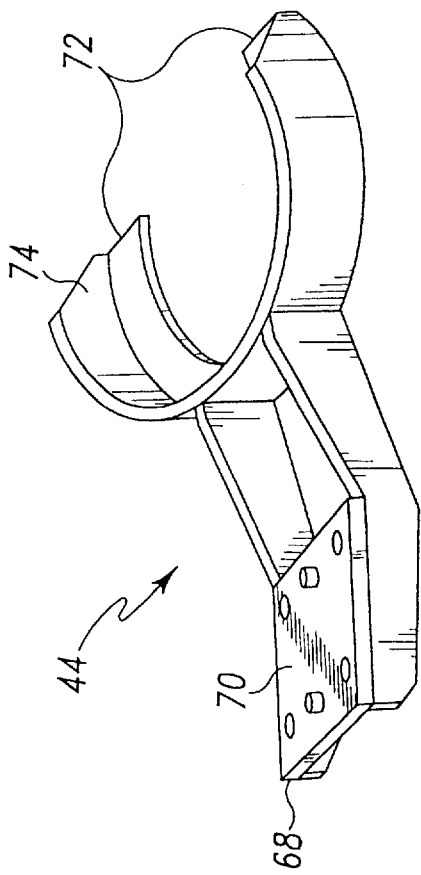
FIG. 5 is a perspective view of an example rotary arm illustrated in FIG. 3.

Referring now to FIG. 5, the example rotary arm 44 is illustrated in a perspective detached from the rotary actuator 42 and the head spray assembly 46. The rotary arm 44 can be formed of, for example, metal, plastic or other similar corrosion resistant rigid material capable of supporting the head spray assembly 46. The illustrated rotary arm 44 may be made of welded 3⁄16" stainless steel plate. The longitudinally extending rotary arm 42 is adapted to be coupled to the rotatable head 58 at a proximal end 68 that comprises a third flat plate 70. A distal end 72 of the rotary arm 44 may form an enclosure support 74 that is fixedly connected to the head spray assembly 46. The illustrated enclosure support 74 is a generally horseshoe shaped structure that is adapted to partially surround the head spray assembly 46 to provide vertical and horizontal support. The rotary arm 44 is coupled to the head spray assembly 46 by fasteners, such as, for example, screws, rivets or similar fastening mechanism.

Referring to FIGS. 2 and 3, the illustrated example head spray assembly 46 is a generally circular structure that is formed to be slightly larger in diameter than the wafer carriers 28. The example head spray mechanism 32 is illustrated in the spray position in FIG. 3 such that the head spray assembly 46 is positioned between the wafer carrier 28, which is detachably coupled with the conveyor 26, and the BPM 30. As illustrated, the top of the head spray assembly 46 is positioned with a top surface 76 adjacently below the wafer carrier 28 such that the wafer 16 (not shown in FIGS. 2 and 3) is positioned therebetween. In addition, the bottom of the head spray assembly 46 is positioned with a bottom surface 78 adjacently above the BPM 30. In other examples, the head spray assembly 46 may be oriented with the top surface 76 adjacently above, beside, below or some combination thereof with respect to the wafer carrier 28. In these examples, the orientation of the head spray assembly 46 with respect to the wafer carrier 28 may depend on the attachment of the wafer carrier 28 to the conveyor 26, and/or the location of the wafer 16 on the wafer carrier 28.

Figure 6:
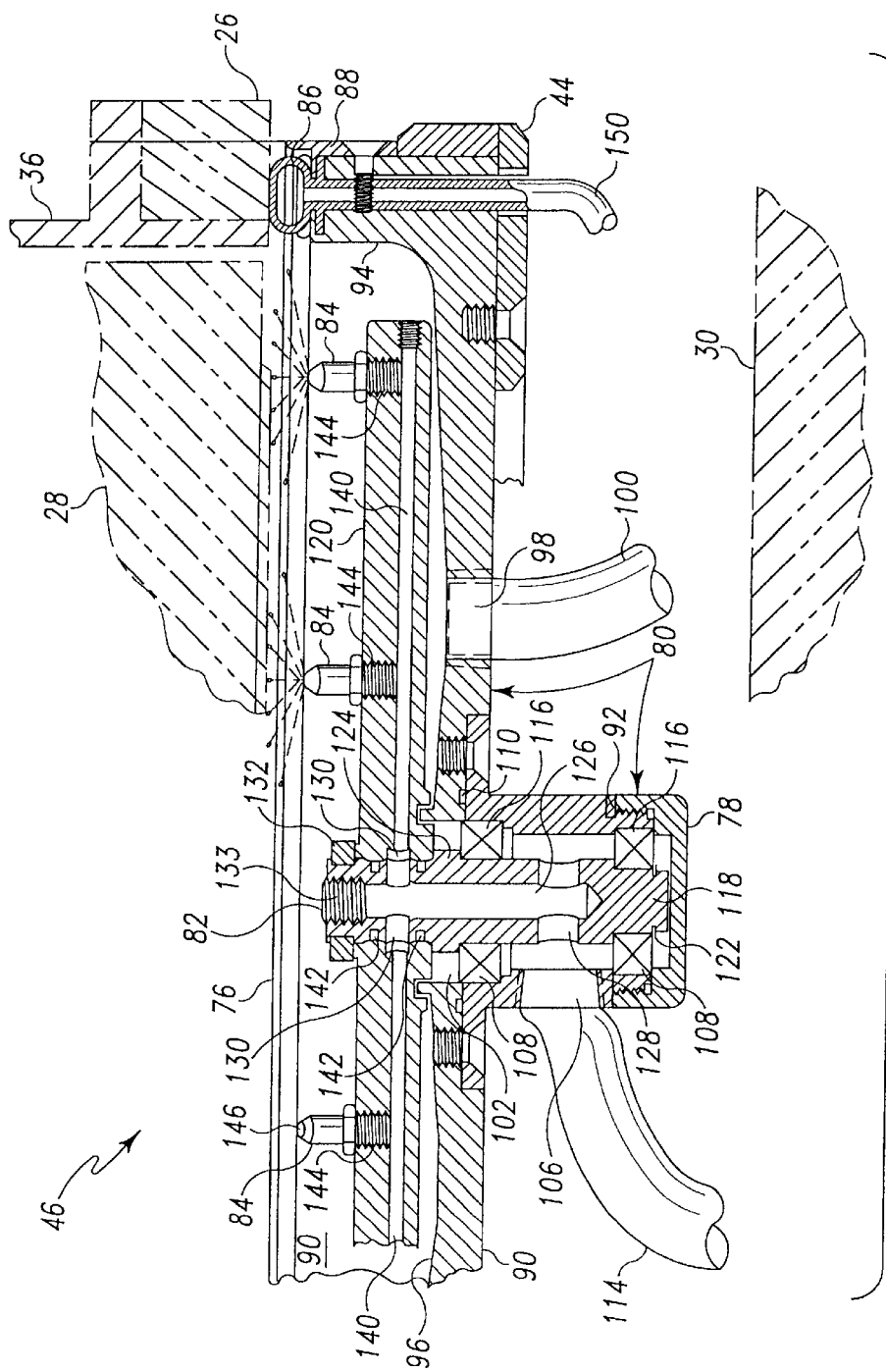
FIG. 6 is a cross sectional view of a portion of an example head spray mechanism taken along line 6—6 in FIG. 3.

FIG. 6 illustrates a cross sectional view of a portion of the example wafer polishing system 10 illustrated in FIG. 3 that includes the conveyor 26, the wafer carrier 28, the rotary arm 44 and one example embodiment of the head spray assembly 46. The illustrated head spray assembly 46 includes a housing 80, a rotating element 82, a plurality of spray nozzles 84, a bladder 86 and a bladder retainer ring 88 as illustrated. The housing 80 can be formed of plastic such as polyethylene terephthalate (PET), metal or any other rigid material.

The illustrated example housing 80 includes a spray cavity 90 and a bearing enclosure 92. The spray cavity 90 forms the upper portion of the housing 80 and generally resembles a cup-like shape. At the top of the head spray assembly 46, the spray cavity 90 includes an opening that is defined by an annular wall 94 that forms the top surface 76. The annular wall 94 extends from the top surface 76 to a basin 96 that is integrally formed with the annular wall 94 and defines the closed end of the spray cavity 90.

The illustrated basin 96 is sloped in the horizontal plane towards a drain outlet 98 to allow gravitational drainage of liquid from the spray cavity 90. The drain outlet 98 is an aperture that penetrates the basin 96 and is coupled with a drain hose 100. The drain hose 100 forms a passageway to channel liquid out of the wafer polishing system 10. Alternatively, the drain outlet 98 may be located, for example, in the annular wall 94 or any other advantageous location to provide gravitational drainage based on the orientation of the head spray assembly 46. The basin 96 may also include a shaft aperture 102 that forms a passageway to the bearing enclosure 92.

The illustrated bearing enclosure 92 includes a liquid inlet 106 and a plurality of bearings 108 as illustrated in FIG. 6. The bearing enclosure 92 is a generally cylindrical, longitudinally extending, hollow tube that includes an integrally formed circumferentially surrounding lip formed to coupling with the spray cavity 90 at a first end 110. Fasteners, such as, for example, screws fixedly coupled the bearing enclosure 92 to the spray cavity 90, as illustrated. The bottom surface 78 of the head spray assembly 46 forms an enclosed second end of the bearing enclosure 92.

The liquid inlet 106 is an aperture in the outer surface of the bearing enclosure 92 that is in liquid communication with the hollow interior of the bearing enclosure 92 and with a liquid supply line 114. The liquid supply line 114 forms a passageway to a pressurized liquid supply (not shown). The wafer polishing system 10 using, for example, pilot operated pneumatic valves (not shown), or other similar pressure control devices, controls the supply of pressurized liquid to the liquid supply line 114.

The bearings 108 are sealed thrust bearings that are axially positioned in the bearing enclosure 92 near the first end 110 and near the bottom surface 78. The rotatable bearings 108 are fixedly mounted in annular grooves 116 in the inner surface of the bearing enclosure 92 by friction fit, adhesive fit or other similar mounting mechanism. The bearings 108 circumferentially surround a portion of the rotating element 82 that is disposed within the housing 80.

The rotating element 82 includes a rotary shaft 118 and a manifold 120. The rotating element 82 is rotatably coupled with the housing 80 by the rotary shaft 118. The rotary shaft 118 axially extends through the hollow interior of the bearing enclosure 92 and is held in position by the bearings 108. The rotary shaft 118 can be formed of, for example, steel, plastic or other similarly rigid material.

The illustrated rotary shaft 118 is stainless steel and is fixedly positioned within the bearings 108 by a snap ring 122 and a shoulder 124. The snap ring 122 circumferentially surrounds the rotary shaft 118 and is mounted within an annular groove (not shown) in the surface thereof. The shoulder 124 is an integrally formed raised annular ring that surrounds a portion of the rotary shaft 118 as shown. The rotary shaft 118 is also formed to include an internal passageway 126 that axially extends from a first aperture 128 to a plurality of second apertures 130. The passageway 126 is in liquid communication with the liquid inlet 106 via the first aperture 128, and the manifold 120 via the second apertures 130.

The manifold 120 is coupled to the rotary shaft 118 by being fixedly compressed between the shoulder 124 and a fastener 132. The fastener 132 can be for example, a weld, a threaded connection or any other similar fastening mechanism. The illustrated fastener 132 is a locknut that engages threads 133 on the outer surface of the rotary shaft 118.

Figure 7:
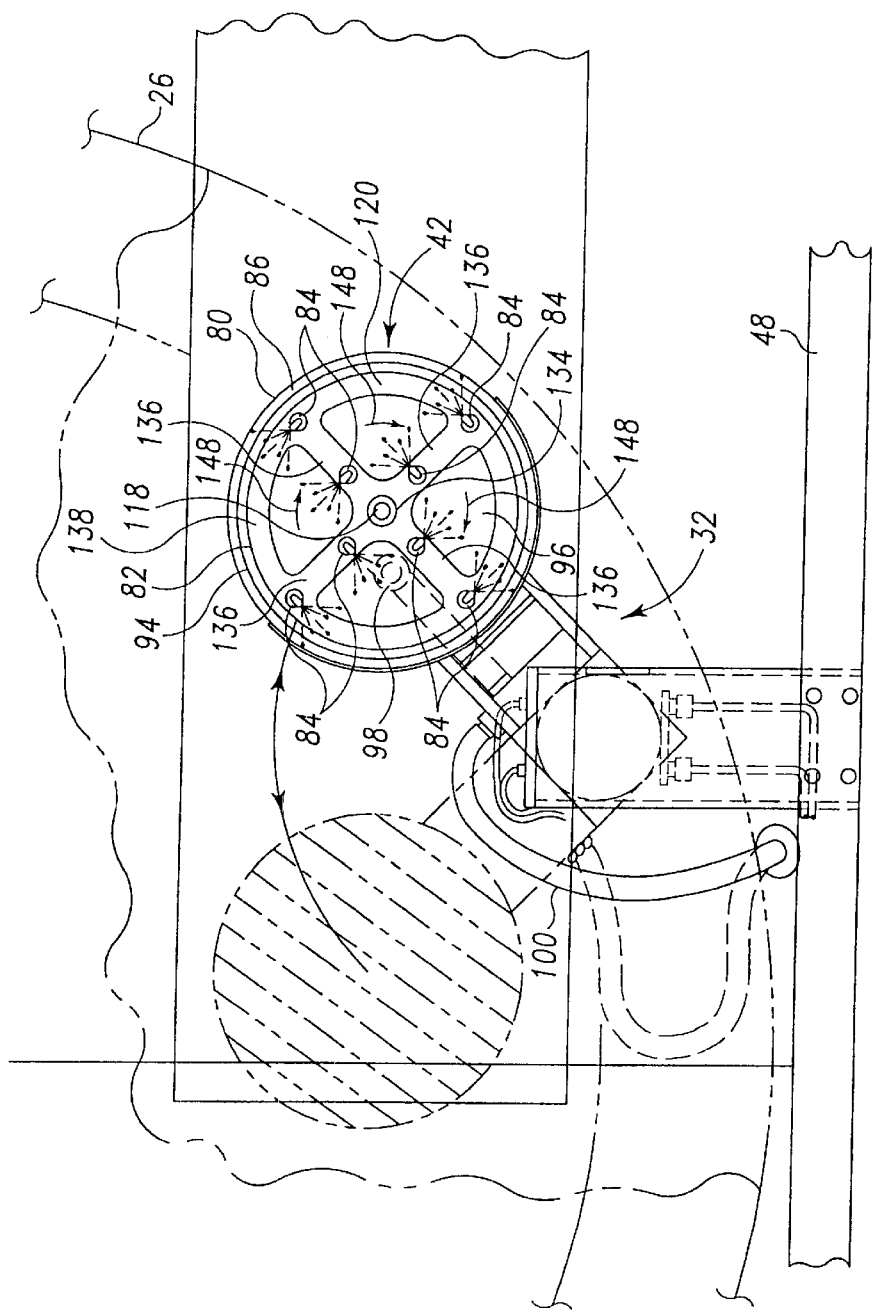
FIG. 7 is a plan view of a portion of the semiconductor wafer polishing system of FIG. 2 showing additional detail with regard to the example head spray mechanism of FIG. 6.

FIG. 7 illustrates a portion of the conveyor 26 and the head spray mechanism 32 illustrated in FIG. 2 with the wafer carrier 28 removed for illustrative purposes and the head spray mechanism 32 illustrated in the spray position. The presently preferred manifold 120 is illustrated in FIG. 7 and includes a hub 134, a plurality of spokes 136 and an outer ring 138 as illustrated. The hub 134 is adapted to circumferentially surround an upper portion of the rotary shaft 118 and is concentric therewith. Integrally formed with the hub 134 are the spokes 136. The spokes 136 extend radially outward from the hub 134 substantially parallel to the basin 96 and are integrally formed with the outer ring 138. The outer ring 138 is concentric with the hub 134 and the rotary shaft 118 and is adjacent to the annular wall 94. The surface of the manifold 120 that is adjacent the opening in the top of the head spray assembly 42 defines a face of the rotating element 82.

Referring now to FIGS. 6 and 7, the spokes 136 are hollow and define passageways 140 therein that extend through the hub 134 and are in liquid communication with the second apertures 130. A plurality of O-rings 142 are positioned to circumferentially surround the rotary shaft 118 on opposite sides of the second apertures 130 to form a watertight seal between the rotary shaft 118 and the manifold 120. The O-rings 142 can be formed of rubber such as Buna-N rubber, silicone or other similar material capable of creating a seal. The passageways 140 are also in liquid communication with a plurality of apertures 144 that are located on the face of the rotating element 82 and penetrate the surface of the spokes 136.

Also positioned on the face of the rotating element 82 are the spray nozzles 84. The spray nozzles 84 can be coupled to the apertures 144 by threaded connection, snap fit, frictional fit or some other similar fastening mechanism. In the illustrated example, the spray nozzles 84 are coupled to the manifold 120 by threaded connection. The spray nozzles 84 are formed to include an internal passageway (not shown) that is in liquid communication with the passageways 140 via the apertures 144. The longitudinally extending internal passageway of each spray nozzle 84 extends to an aperture 146. The aperture 146 is located near the end of the spray nozzle 84 that is opposite the manifold 120 as best illustrated in FIG. 6. The apertures 146 may be formed to provide a predetermined spray pattern at an angle of between about 45 and 60 degrees with respect to the longitudinal axis of the spray nozzles 84. The spray pattern can be, for example, a fan spray pattern, a cone spray pattern or any other pattern that provides a uniform spraying action.

The angle of the spray pattern can be any angle that is capable of discharging liquid through the opening at the top of the housing 80 while creating a reverse force. The reverse force is defined to be a force vector that is parallel to the face of the manifold 120 and has sufficient rotational force to impart rotation upon the rotating element 82 as illustrated by arrows 148 in FIG. 7. The reverse force is created in a direction that is generally opposite the direction that the liquid is discharged from the spray nozzles 84. The direction of the discharge of liquid from the spray nozzles 84 is uniformly aligned such that the reverse forces created by the liquid discharge work cooperatively to impart rotation on the rotating element 82. In the illustrated manifold 120, there are eight spray nozzles 84 that are uniformly distributed on the face of the rotating element 82 to impart rotation thereon when activated to discharge liquid.

Alternatively, the spray nozzles 84 are individually rotatable with respect to the rotating element 82 as a result of the reverse force created by liquid discharged from the spray nozzles 84. In this alternative, the rotating element 82 is fixedly coupled to the housing 80 and the spray nozzles 84 rotate therein. Individual rotation of the spray nozzles 84 can result from, for example, the apertures 146 being offset from the central axis of the spray nozzles 84; or the spray nozzles 84 being mounted in rotatable disks (not shown) offset from the rotating axis thereof. In yet another alternative, the rotation of the rotating element 82 is created by, for example, a motor (not shown), water impacting an impeller (not shown) or other prime mover that is capable of imparting rotational force on the rotating element 82.

Referring again to FIG. 6, circumferentially surrounding the annular wall 94 toward the top surface 76 thereof is the bladder 86. The bladder 86 is compressibly retained against the exterior surface of the annular wall 94 by the bladder retainer ring 88 as shown. The bladder retainer ring 88 circumferentially surrounds the bladder 86 and is coupled to the annular wall 94 by fasteners. The fasteners may be for example welds, rivets or any other fastening mechanism. The inflatable bladder 86 can be formed of, for example, rubber such as Buna-N rubber, silicone or some other flexible material capable of being expanded and contracted.

The bladder 86 forms an annular ring that has an interior annulus that receives pressurized air, or some other pressurized fluid, from a bladder control hose 150. The bladder control hose 150 provides a passageway that longitudinally extends from a pressurized fluid source (not shown) to the head spray assembly 46. The wafer polishing system 10 using, for example, pilot operated pneumatic valves or other similar pressure control devices controls the supply of pressurized fluid to the bladder control hose 150. The pressurized fluid source is controlled based on a pressure sensor (not shown) that monitors the fluid pressure within the bladder 86. In a deflated state, the bladder 86 collapses to a height that is below the top surface 76 of the head spray assembly 42. When inflated, the bladder radially expands to extend above the top surface 76.

Referring now to FIGS. 2, 3, 6 and 7, the operation of the illustrated head spray mechanism 32 will be explained. When a wafer carrier 28 with a wafer mounted thereon completes the polishing operation at one of the polishing stations, 34a, 34b 34c, the wafer carrier 28 is detachably mounted on the conveyor 26. The head spray mechanism 32 is then activated. Activation of the head spray mechanism 32 to clean and rinse the wafer carrier 28 and the wafer 16 can be done alone or in conjunction with activation of a head diametrical wash. When activated, the rotary actuator 42 is activated to rotatably pivot the rotary arm 44 thereby moving the head spray mechanism 32 from the park position as illustrated in FIG. 2, to the spray position as illustrated in FIG. 7. The wafer polishing system 10 is provided feedback signals from the position sensors in the rotary actuator 42 to indicate that the head spray mechanism 32 has swung from the park position to the spray position.

When in the spray position, the head spray assembly 46 is positioned adjacent the wafer carrier 28 with the wafer 16 positioned therebetween. The bladder 86 is then inflated by operating the pilot operated pneumatic valves. Once inflated, the bladder 86 contacts a portion of the underside of the conveyor 26 that surrounds the wafer carrier 28. The bladder 86 thereby forms a circular seal between the head spray assembly 46 and the conveyor 26 with the wafer carrier 28 positioned therein. The pressure sensor monitors the inflation pressure of the bladder 86 and provides feedback signals when the bladder 86 achieves a predetermined pressure. The feedback signals are used to initiate operation of pilot valves to introduce pressurized liquid to the liquid supply line 114. The liquid flows through the inlet 106 and into the housing 80. The liquid can be water, deionized (DI) water, or any other liquid capable of rinsing and cleaning the wafer carrier 28 and the wafer 16.

Within the housing 80, the liquid flows through the passageway 126 in the rotary shaft 118, through the passageways 140 in the manifold 120 and is discharged from the spray nozzles 84. The angle of discharge of the spray nozzles 84 causes the liquid to be in liquid communication with the face of the wafer 16 and the sides of the wafer carrier 28. The liquid is in liquid communication with the sides of the wafer carrier 28 since the liquid also sprays into the annulus formed between the wafer carrier 28 and the conveyor 26. The discharge of liquid from the spray nozzles 84 creates the reverse force thereby causing the rotating element 82 to rotate as indicated by arrows 148 in FIG. 7. Rotation of the rotating element 82 allows the spray pattern of the spray nozzles 84 to aggressively and uniformly rinse and clean the face of the wafer 16 and the exposed surfaces of the wafer carrier 28.

The liquid is contained within the head spray assembly 46 by the bladder 86 and flows by gravity to the basin 96 within the housing 80. The liquid containing fluid and materials rinsed from the wafer 16 and the wafer carrier 28 flows by gravity to the drain outlet 98. From the drain outlet, the liquid flows through the drain hose 100 and out of the wafer polishing system 10. The drain outlet 98 is capable of accommodating liquid discharged from the head spray mechanism 32 as well as from the diametrical face wash when both are activated simultaneously.

The wash time of the head spray mechanism 32 is variable and can be controlled to correspond with the throughput requirements of the wafer polishing system 10 and the degree of washing required. Both head spray mechanisms 32 can operate simultaneously or individually depending on system requirements. When the wash time such as approximately 5 seconds has expired, the liquid supplied to the liquid inlet 106 is turned off and the bladder 86 is subsequently deflated. The rotary actuator 42 is then actuated to pivotally rotate the rotary arm 44 to return the head spray mechanism 32 to the park position until the next polishing operation is completed.

Figure 8:
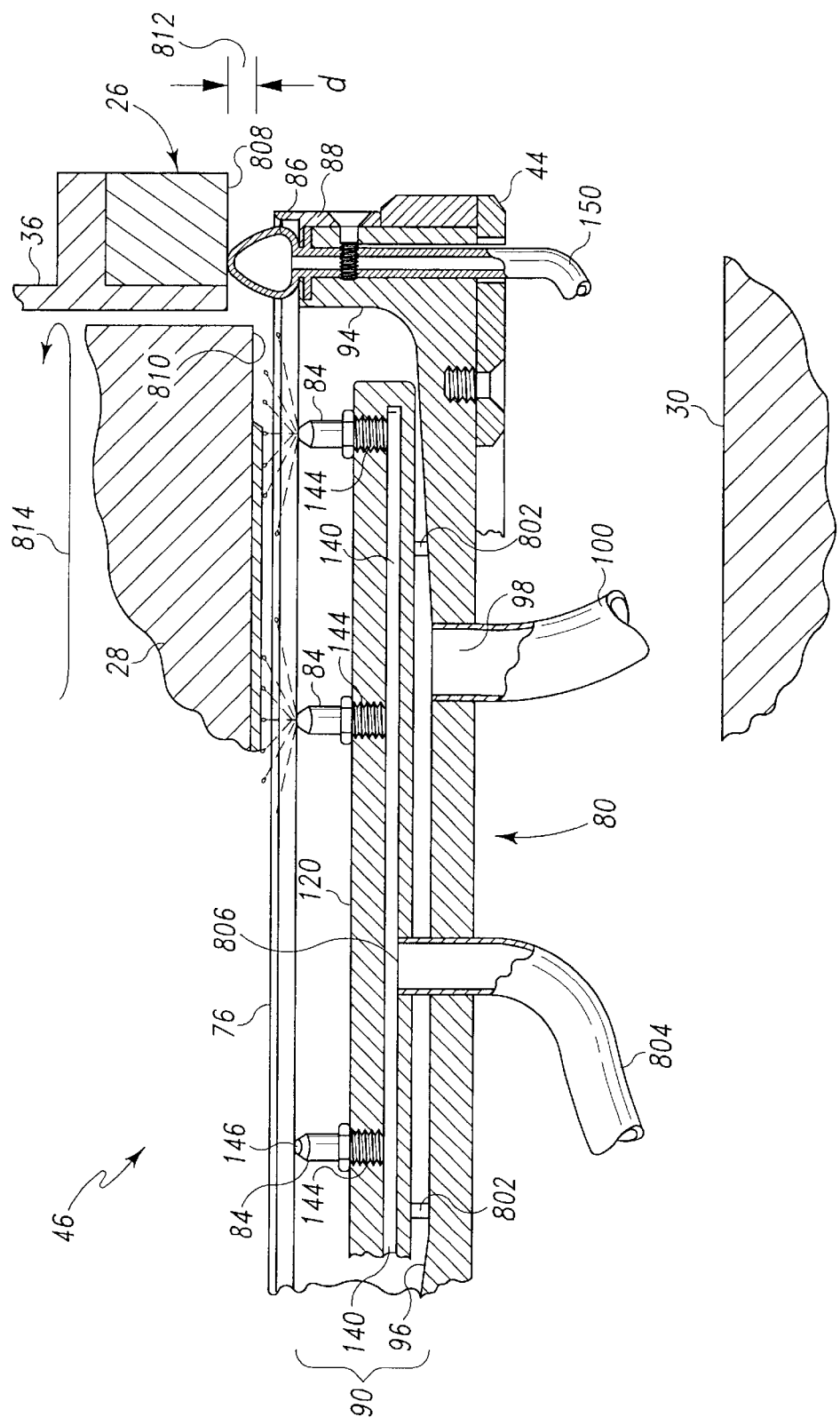
FIG. 8 is a cross sectional view of a portion of another example head spray mechanism taken along line 6—6 in FIG. 3.

FIG. 8 illustrates a cross-sectional view of a portion of the example wafer polishing system 10 illustrated in FIG. 3 that includes the conveyor 26, the wafer carrier 28, the rotary arm 44 and another example of the head spray assembly 46. In this example, the head spray assembly 46 does not include the bearing enclosure 92 (FIG. 6) or the rotary shaft 118 (FIG. 6) in the housing 80 since the spray nozzles 84 do not rotate. The manifold 120 may be positioned within the spray cavity 90 above the basin 96 surrounded by the annular wall 94.

Similar to the previously described examples, the top surface 76 of the annular wall 94 may form an aperture that is large enough to partially surround at least a portion of the wafer carrier 28. In other words, the aperture may be larger than the side of the wafer carrier 28 on which the semiconductor wafer is mounted and allow liquid communication between the head spray assembly 46 and the wafer carrier 28. The manifold 120 may be mounted above the basin 96 on columns 802 to allow liquid within the spray cavity 90 to flow by gravity to the drain outlet 98.

Alternatively, the manifold 120 may be mounted to the annular walls 94 or any other part of the head spray assembly 46 capable of maintaining the position of the manifold 120 in the spray cavity 90. In another alternative, the housing 80 may include spray apertures (not shown) and the manifold 120 may be mounted external to the housing 80. The manifold 120 may be positioned with respect to the housing 80 such that liquid discharged from the spray nozzles 84 is discharged into the housing 80 through the spray apertures to allow liquid communication with the wafer carrier 28 and semiconductor wafer.

In the head spray assembly 46 illustrated in FIG. 8, liquid may be selectively supplied to the manifold 120 by a liquid supply line 804 via a manifold aperture 806. The liquid supply line 804 may penetrate the basin 96 to provide a channel to the passageways 140 within the manifold 120. Alternatively, the liquid supply line 804 may penetrate the annular wall 94. The passageways 140 provide liquid communication to the spray nozzles 84 via the apertures 144. Any number of spray nozzles 84, corresponding passageways 140 and apertures 144 may be present on the manifold 120. Liquid may be discharged from the apertures 146 of the spray nozzles 84. The spray pattern and spray angle of the spray nozzles 84 may be optimized for cleaning of the wafer carrier 28 and semiconductor wafer since there is no rotational movement of the manifold 120.

Figure 9:
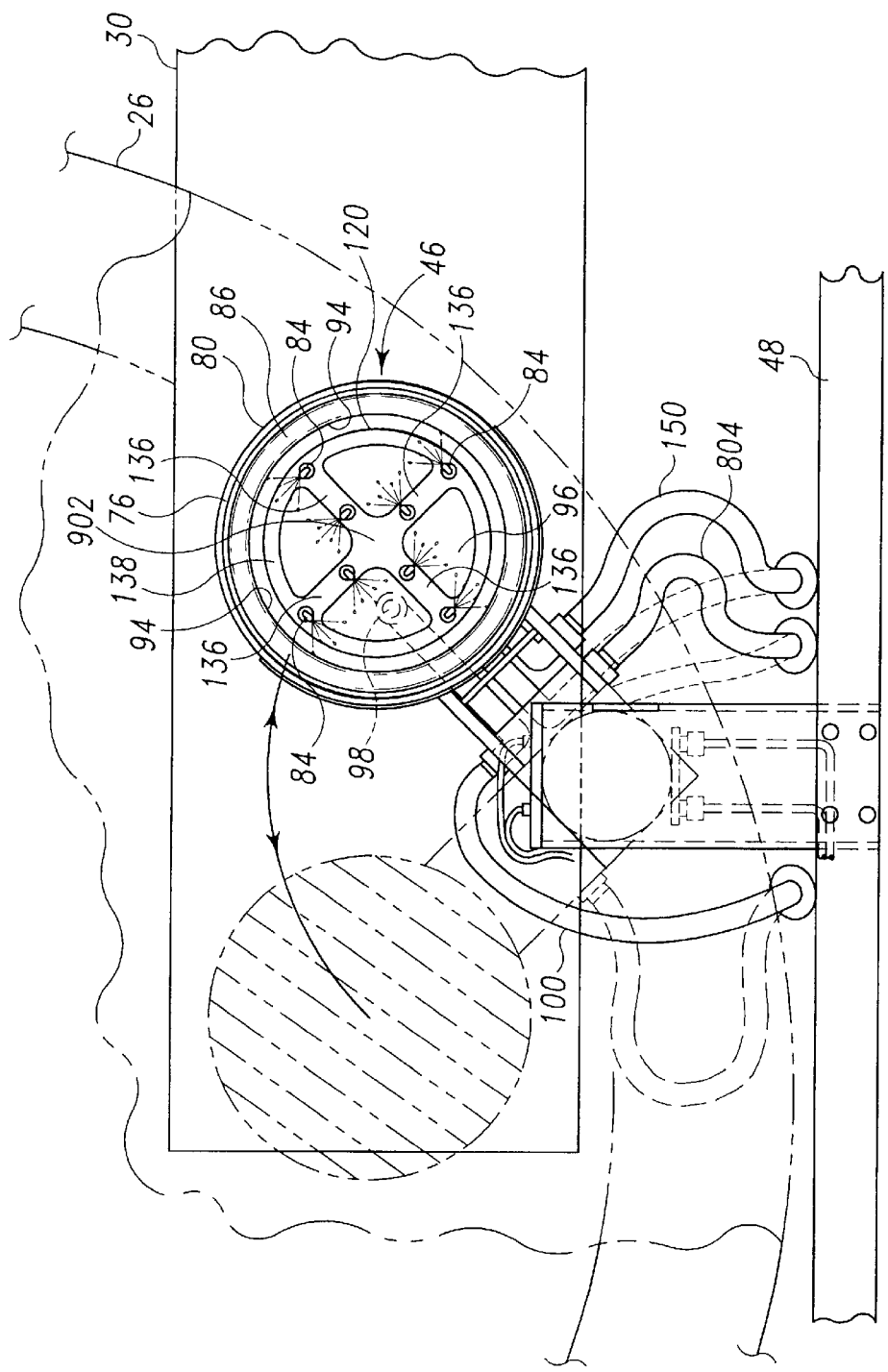
FIG. 9 is a plan view of a portion of the semiconductor wafer polishing system of FIG. 2 showing additional detail with regard to the example head spray mechanism illustrated in FIG. 8.

FIG. 9 illustrates a portion of the conveyor 26 and the head spray mechanism 32 illustrated in FIG. 2 with the wafer carrier 28 removed for illustrative purposes and the head spray assembly 46 of FIG. 8 illustrated in the spray position. Similar to FIG. 7, the manifold 120 is illustrated to include a hub 902, a plurality of spokes 136 and an outer ring 138 positioned above the basin 96 and circumferentially surrounded by the annular wall 94. The spokes 136 and the outer ring 138 may include the passageways 140 (FIG. 8) and the spray nozzles 84. The hub 902 may be connected to the liquid supply line 804. Similarly, the drain outlet 98 is connected to the drain hose 100.

A seal may be positioned near the top surface 76 of the housing 80 to circumferentially surround the spray cavity 90 and selectively provide a continuous seal. The seal may be any material capable of providing a barrier to deter the flow of liquid. In addition, the seal may be capable of being activated to transform between a sealed state in which a sealing function is provided and an unsealed state. In the example illustrated in FIGS. 8 and 9, the seal is in the form of the bladder 86. The bladder 86 may be selectively inflated and deflated via the bladder control hose 150 connected thereto to be activated to move between the sealed and unsealed state.

Referring now to FIGS. 8 and 9, during operation, the head spray assembly 46 may be moved from the parked position (first position) to the spray position (second position). In the spray position, the head spray assembly 46 may be positioned such that the bladder 86 is adjacent to at least one surface. In the illustrated example of FIG. 8, the surface is a bottom surface 808 of the conveyor 26. In other examples, the surface may be any other substantially flat continuous surface(s) that may be positioned adjacent the bladder 86. The proximity of the surface to the bladder 86 allows the bladder 86 to act as a seal when inflated (activated). The seal is a substantially liquid tight seal formed between the surface and the head spray assembly 46 to retain liquid discharged by the spray nozzles 84 within the spray cavity 90.

Alternatively, the seal may be absent and the discharged liquid may be contained in the spray cavity 90 by the annular wall 94 and the basin 98. In this alternative, some discharged liquid may escape from the spray cavity 90. To minimize loss of liquid from the spray cavity 90, the top surface 76 may be positioned as close as possible to the wafer carrier 28. In addition, the aperture formed by the top surface 76 may be formed sufficiently larger than the wafer carrier 28 to satisfactory contain the discharged liquid.

As part of this operation, the wafer carrier 28 may be moved to a cleaning position. The cleaning position may be any location that allows the wafer carrier 28 and semiconductor thereon to be cleaned and rinsed without restriction or interference. Movement of the wafer carrier 28 to the cleaning position may be accomplished with the same device used to lower the wafer carrier 28 from the conveyor 26 to the BPMs 30 (FIG. 2). Alternatively, a separate mechanism may be used to move the wafer carrier 28 to the cleaning position.

While in the cleaning position, the wafer carrier 28 may be aligned with the aperture formed by the top surface 76 of the annular wall 94. The wafer carrier 28 may be aligned such that at least a portion of the wafer carrier 28 is subject to liquid discharged from the spray nozzles 84. Liquid communication between the wafer carrier 28, the semiconductor wafer and the spray nozzles 84 may involve aligning the wafer carrier 28 with the aperture such that the wafer carrier is positioned above the spray cavity 90 close to the top surface 76 as illustrated. In other examples, the wafer carrier may be aligned with the aperture such that at least a portion of the wafer carrier 28 is positioned within the spray cavity 90, or in any other position where the wafer carrier 28 is in range of the fluid discharged by the spray nozzles 84.

In the example illustrated in FIG. 8, when in the cleaning position a bottom surface 810 of the wafer carrier 28 may be a distance "d" 812 below the bottom surface 808 of the conveyor 26. The wafer carrier 28 may be detached from the head retainer ring 36 and moved away from the conveyor 26 towards the head spray assembly 46 to reach the cleaning position. While detached from the conveyor 26, the wafer carrier 28 may be rotated, vibrated, reciprocated, etc. Once in the cleaning position, the wafer carrier 28 may be placed in motion relative to the head spray assembly 46 to further enhance the clean and rinse. For example, the wafer carrier 28 may be rotated in one direction as illustrated by arrow 814. Alternatively, the wafer carrier 28 may remain fixed in position, be reciprocated, be alternately rotated in both directions, or be place in any other form of motion to enhance the clean and rinse.

Pressurized air may be introduced to the bladder 86 via the bladder control hose 150 to form the seal between the bottom surface 808 of the conveyor 26 and the head spray assembly 46 as illustrated. Pressurized liquid, such as DI water, may be supplied through the liquid supply line 804. The liquid may flow through the passageways 140, the apertures 144 and out the apertures 146 of the spray nozzles 84.

As in the previous examples, the liquid may clean and rinse the wafer carrier 28 and the semiconductor wafer thereon. The liquid may be contained in spray cavity 90 with the inflated bladder 86, the annular wall 94 and the basin 96, and drain by gravity to the drain outlet 98. Material from the wafer carrier 28 and semiconductor may be included in the liquid that drains through the drain outlet 98 and is channeled by the drain hose 100 away from the BMP 30. Once the clean and rinse is complete, the bladder 86 may be deactivated (deflated) and the head spray assembly 46 may be actuated to the park position.

Figure 10:
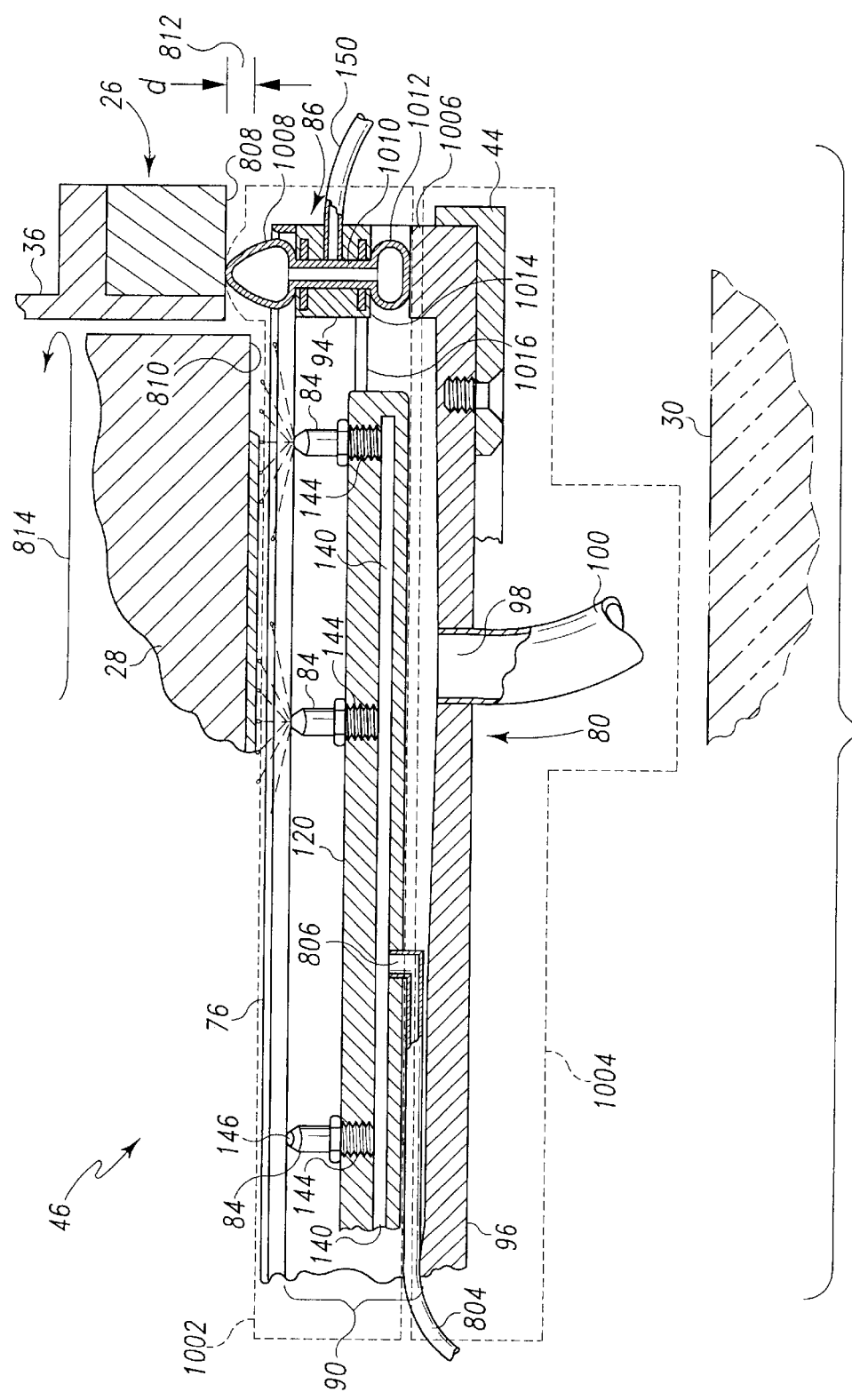
FIG. 10 is a cross sectional view of a portion of yet another example head spray mechanism taken along line 6—6 in FIG. 3.

FIG. 10 is another cross-sectional view of a portion of the example wafer polishing system 10 illustrated in FIG. 3 that includes the conveyor 26, the wafer carrier 28, the rotary arm 44 and yet another example of the head spray assembly 46. Similar to FIG. 8, in this example, the head spray assembly 46 does not include the bearing enclosure 92 (FIG. 6) or the rotary shaft 118 (FIG. 6) as part of the housing 80 since the spray nozzles 84 do not rotate.

The illustrated housing 80, however, includes a first part 1002 and a second part 1004 capable of being separated. The first part 1002 includes the annular wall 94 and the aperture formed by the surrounding top surface 76. The aperture is formed to be larger than the end of the wafer carrier 28 where the semiconductor wafer is mounted. The second part 1004 includes the basin 96. Together the first and second parts 1002 and 1004 may form the spray cavity 90.

The basin 96 of the illustrated head spray assembly 46 includes the drain outlet 98 and is coupled to the drain hose 100. In addition, the basin 96 includes a basin surface 1006 forming a shelf surrounding the basin 96. The basin surface 1002 is a circular flat surface that is substantially the same diameter as the bladder 86. Accordingly, when the basin surface 1002 is positioned adjacent to the bladder 86 a seal may be formed when the bladder 86 is inflated.

Similar to the previous example of FIG. 8, the annular wall 94 of the spray cavity 90 includes a seal and the manifold 120. In this example, there are two seals that are provided by the bladder 86. The bladder 86 includes a first inflatable section 1008 connected by a connecting chamber 1010 to a second inflatable section 1012. The connecting chamber 1010 is coupled with the control air hose 150. Alternatively, the connecting chamber 1010 may be omitted and the first and second chambers 1008 and 1012 may be two separate bladders separately coupled with the control air hose(s) 150. In other alternatives, the seals may be independent mechanisms.

The first inflatable section 1008 may provide a seal between the bottom surface 808 of the conveyor 26 and the top surface 76 of the head spray assembly 46 (the annular Wall portion of the spray cavity 90) when activated (inflated). Similarly, the second inflatable section 1012 may provide a seal between a bottom surface 1014 of the annular wall 94 and the basin surface 1006 when activated (inflated). Alternatively, the first inflatable section 1008 may be a permanent seal. The permanent seal may maintain a water-tight seal between the top surface 76 and/or the annular wall 94 and some surface within the wafer polishing system. In still another alternative, one or both of the seals may be absent and the discharged liquid may be contained by the annular wall 94 and the basin 96 as previously discussed.

The annular wall 94 may also be coupled with the manifold 120 by a plurality of struts 1016 to maintain the manifold 120 circumferentially surrounded by the annular wall 94. In another example, the manifold 120 may be mounted to a structure that is separate from the annular wall 94. In still another example, the manifold 120 may be mounted external to the annular wall 94 with spray apertures (not shown) in the annular wall 94 to allow liquid communication with the wafer carrier 28 and semiconductor wafer as previously described.

Similar to the previous example of FIGS. 8 and 9, the manifold 120 includes passageways 140, apertures 144, spray nozzles 84, spray nozzle apertures 146 and the manifold aperture 806. In this example, however, the liquid supply line 804 that is coupled to the manifold aperture 806 does not penetrate the basin 96. Instead the liquid supply line 804 may be coupled to the bottom of the manifold 120 and penetrate the annular wall 94 to exit the spray cavity 90.

Figure 11:
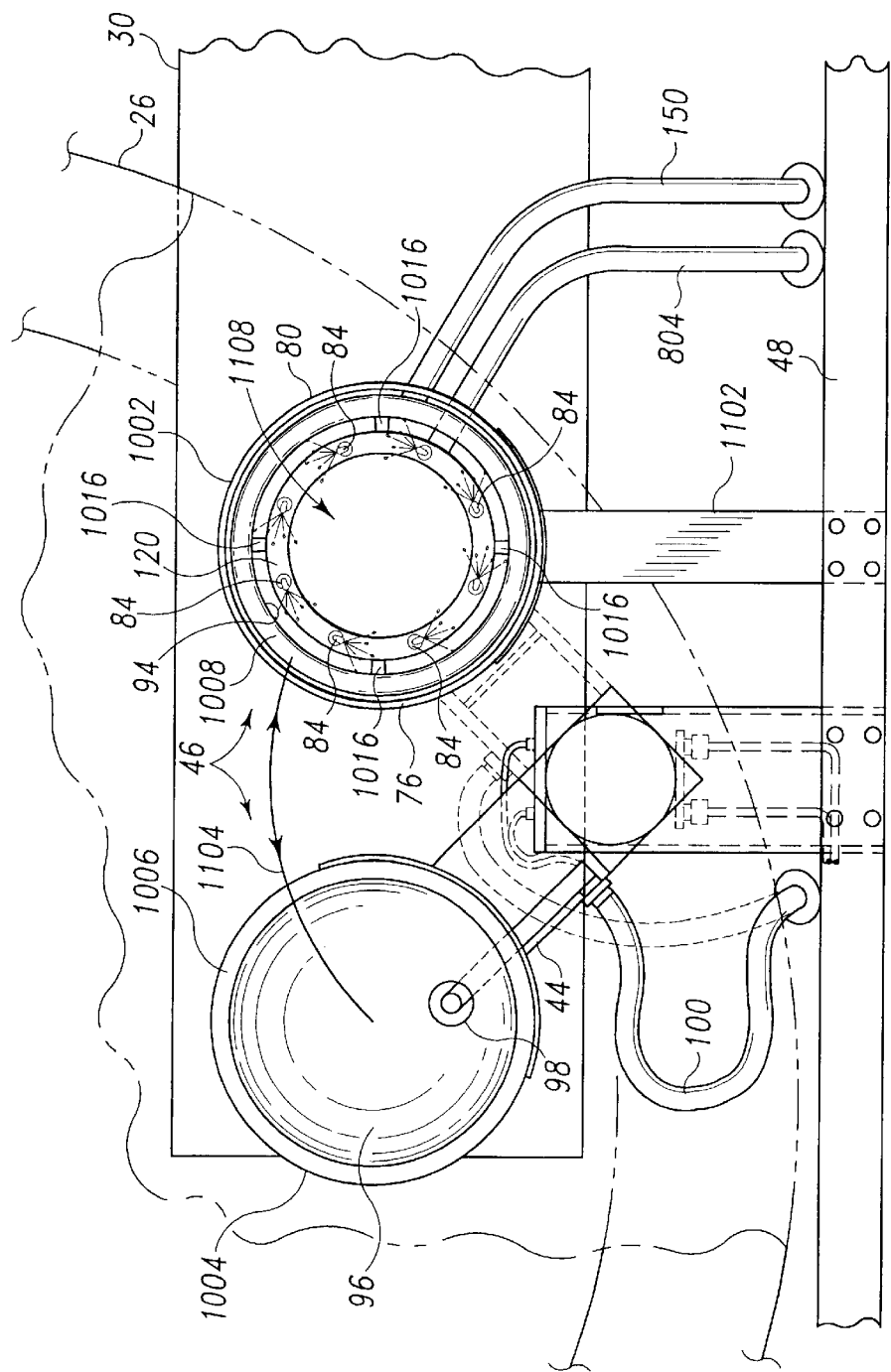
FIG. 11 is a plan view of a portion of the semiconductor wafer polishing system of FIG. 2 showing additional detail with regard to the example head spray mechanism illustrated in FIG. 10.

FIG. 11 similarly illustrates a portion of the conveyor 26 and the head spray mechanism 32 illustrated in FIG. 2 with the wafer carrier 28 removed for illustrative purposes. In the illustrated example, the first part 1002 of the head spray assembly 46 of FIG. 10 that includes the annular wall 94 is fixedly coupled to the frame 48 of the wafer polishing system with at least one head spray assembly member 1102. Also coupled with the annular wall 94 are the control air hose 150 and the liquid supply line 804 to provide air to the bladder 86 and liquid to the manifold 120, respectively.

The first part 1002 of the head spray assembly 46 is fixed in the position previously referred to as the second position, or spray position. The second part 1004 of the head spray assembly 46 that includes the basin 96 is coupled with the rotary arm 44 that was previously discussed with reference to FIG. 5. The basin 96 includes the drain outlet 98 that is coupled to the drain hose 100. The second part 1004 of the head spray assembly 46 may be moved between the second position (spray position) and the first position (park position) as illustrated by arrow 1104. In FIG. 11, the second part 1004 is illustrated in the park position.

The manifold 120 may include only an outer ring 1106 with passageways 140 (FIG. 10), apertures 144 (FIG. 10) and spray nozzles 84. The diameter of the outer ring 1106 may be larger than the end of the wafer carrier 28 that the semiconductor wafer is mounted on. The annular wall 94 may circumferentially surround the outer ring 1106. Inside the outer ring 1106 an aperture is formed that is a passageway 1108 through the first part 1002. The passageway is large enough to allow the wafer carrier 28 to pass through the annular wall 94 and the outer ring 1106 when the second part 1004 is in the park position. The wafer carrier 28 may therefore be lowered through the passageway 1108 past the annular wall 94 and the manifold 120 to the BPM 30 for polishing.

Referring now to both FIGS. 10 and 11, during operation the wafer carrier 28 may be placed in a cleaning position. Similar to the previous example, when in the cleaning position, the bottom surface 810 of the wafer carrier 28 may be a distance "d" 812 from the bottom 808 of the conveyor 26. In addition, the wafer carrier 28 may be aligned with the aperture formed in the housing 80 by the top surface 76 of the annular wall 94. In the illustrated example, the wafer carrier 28 is aligned to be adjacent the top surface 76 to allow liquid communication with the liquid discharged by the spray nozzles 86. Alternatively, the wafer carrier 28 may be aligned with the aperture to be positioned partially within the spray cavity 90, etc.

The second part 1004 of the head spray assembly 46 may be actuated and moved into the spray position adjacent the first part 1002 of the head spray assembly 46. In the illustrated example, the second part 1004 is positioned under the first part 1002 to form the spray cavity 90. In other examples, the second part 1004 may be moved into any other orientation with respect to the first part 1002 to form the spray cavity 90. The bladder 86 may then be activated to inflate to form the seals.

When the bladder 86 is inflated, seals are formed between the head spray assembly 46 and the surfaces. In the bladder 86 illustrated in FIG. 10, the first and second chambers 1008 and 1012 may each inflate and form a seal with the bottom 808 of the conveyor 26 and the basin surface 1006, respectively. Liquid may then be supplied by the liquid supply line 804 to the manifold 120 and discharged from the spray nozzles 84. The seals provided by the bladder 86 in cooperation with the annular wall 94 and the basin 96 may retain the discharged liquid in the spray cavity 90.

The liquid may fall by gravity to the drain outlet 98 and be channeled out of the housing 80 in the drain hose 100. When the clean and rinse operation is complete, the bladder 86 may be deactivated (deflated) to remove the seals. Once the seals are deactivated, the second part 1004 of the head spray assembly 46 may be actuated to the park position. The wafer carrier 28 may then be moved from the cleaning position into engagement with the head retainer ring 36 of the conveyor 26. Alternatively, the wafer carrier 28 may be moved through the passageway 1108 into a position adjacent the BMP 30 and a polishing operation may be performed.

From the foregoing an improved system for rinsing and cleaning the wafer carrier 28 and the wafer 16 mounted thereon has been described. The system advantageously provides automatic washing while having little or no effect on the throughput operation of the wafer polishing system 10. In addition, the head spray mechanism 32 has the capability to provide aggressive cleaning action while containing the spray liquid. Containment of the spray liquid advantageously minimizes the generation of particles and other material above the polishing process.

It is intended that the foregoing detailed description be regarded as illustrative rather than limiting, and that it be understood that the following claims, including all equivalents, are intended to define the scope of this invention.

What is claimed is:

1. A head spray assembly for cleaning and rinsing a wafer carrier and a semiconductor wafer mounted thereon within a wafer polishing system, the head spray assembly comprising:
   a housing; and
   a spray nozzle operable to discharge liquid in the housing;
   wherein the housing includes an annular wall and a basin, the annular wall fixed in a second position adjacent a wafer carrier, the basin operable to selectively move between a first position spaced away from the wafer carrier and the second position.

2. The head spray assembly of claim 1, wherein the housing includes a drain outlet, the drain outlet operable to channel liquid discharged from the spray nozzle out of the housing.

3. The head spray assembly of claim 1, wherein the housing includes an inflatable bladder, the bladder selectively inflatable to form a seal to assist in the retention within the housing of fluid discharged from the spray nozzle.

4. The head spray assembly of claim 1, wherein the housing is formed to allow fluid communication between the wafer carrier and fluid discharged by the spray nozzle when the basin is in the second position.

5. The head spray assembly of claim 1, wherein the spray nozzle is positioned within the housing.

6. A head spray assembly for cleaning and rinsing a wafer carrier and a semiconductor wafer mounted thereon within a wafer polishing system, the head spray assembly comprising:
   a housing forming a spray cavity wherein at least a portion of the housing is operable to move between a first position spaced away from a wafer carrier and a second position adjacent the wafer carrier;
   a spray nozzle operable to discharge fluid into the spray cavity; and
   a seal included with the housing, wherein the seal is selectively activated to retain discharged fluid in the spray cavity and wherein the seal is a bladder that is selectively inflatable to retain discharged fluid in the spray cavity.

7. The head spray assembly of claim 6, wherein the housing includes a first part and a second part, the first part is fixed in the second position and the second part is selectively movable between the first and second positions.

8. The head spray assembly of claim 7, wherein the spray nozzle is fixed within the first part of the housing.

9. The head spray assembly of claim 7, wherein the seal forms a liquid tight seal between the first part and the second part of the housing when activated.

10. The head spray assembly of claim 7, wherein the first part of the housing includes an annular wall and the seal, and the second part of the housing includes a basin.

11. The head spray assembly of claim 7, wherein the first part of the housing is formed with a passageway, the wafer carrier capable of being selectively moved through the passageway while the second part of the housing is in the first position.

12. The head spray assembly of claim 6, wherein the seal includes an inflatable bladder operable to inflate and form a seal between the head spray assembly and a surface in close proximity to the head spray assembly.

13. A head spray assembly for cleaning and rinsing a wafer carrier and a semiconductor wafer mounted thereon within a wafer polishing system, the head spray assembly comprising:

a housing having an aperture capable of alignment with a wafer carrier and a semiconductor wafer;

a spray nozzle disposed within the housing; and a drain outlet formed in the housing, wherein fluid discharged from the spray nozzle that is retained within the housing flows out of the housing through the drain outlets, wherein the housing includes an annular wall and a basin, wherein the drain outlet is included in the basin and a portion of the annular wall forms the aperture in the housing.

14. The head spray assembly of claim 13, wherein at least a portion of the housing is movable by an actuator between a first position spaced away from the wafer carrier and the semiconductor wafer and a second position adjacent the wafer carrier and the semiconductor wafer.

15. The head spray assembly of claim 13, wherein the housing includes a spray cavity to allow liquid communication between the spray nozzle and at least a portion of the wafer carrier and the semiconductor wafer when the wafer carrier is placed in a cleaning position.

16. The head spray assembly of claim 13, further comprising a liquid supply line coupled with a manifold having a passageway, wherein the manifold is fixedly mounted within the housing and the spray nozzle is mounted on the manifold, wherein the liquid supply line penetrates the housing such that liquid supplied via the liquid supply line travels through the passageway and is discharged by the spray nozzle.

17. The head spray assembly of claim 13, wherein the basin is movable between a first position and a second position, and the annular wall is fixed in the second position.

18. The head spray assembly of claim 17, further comprising an inflatable bladder coupled with the housing, wherein the bladder forms a seal between the basin and the annular wall when inflated.

19. The head spray assembly of claim 13, wherein the housing includes a seal to assist in the retention within the housing of fluid discharged from the spray nozzle.

20. A head spray mechanism for cleaning and rinsing a wafer carrier and a semiconductor wafer mounted thereon within a wafer polishing system, the head spray mechanism comprising:

a housing;

a spray nozzle operable to discharge liquid in the housing; and a rotary actuator, wherein at least a portion of the housing is moveable with the actuator between a first position spaced away from a wafer carrier and a second position adjacent the wafer carrier.

21. The head spray mechanism of claim 20, wherein the housing includes an inflatable seal, the seal selectively inflatable to assist in the retention within the housing of fluid discharged from the spray nozzle.

22. The head spray mechanism of claim 20, wherein the housing includes a first part and a second part, the first part is fixed in the second position, and the second part is selectively movable between the first and second positions.

23. The head spray mechanism of claim 22, wherein the housing includes a first seal and a second seal, the first seal is disposed between the first and second parts, and the second seal is disposed on the housing to assist in the retention within the housing of fluid discharged from the spray nozzle.

24. The head spray mechanism of claim 20, wherein the housing includes a drain outlet configured to allow fluid discharged from the spray nozzle to drain by gravity out of the housing.

25. The head spray mechanism of claim 20, wherein the housing includes a manifold coupled to the spray nozzle, the manifold formed in a ring that allows the wafer carrier to pass through the manifold.

* * * * *